United States Patent
Li et al.

(10) Patent No.: US 6,191,047 B1
(45) Date of Patent: Feb. 20, 2001

(54) ETCHING PROCESS USING A BUFFER LAYER

(75) Inventors: Li Li; Zhiqiang Wu, both of Meridian; Kunal R. Parekh, Boise, all of ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/597,189

(22) Filed: Jun. 20, 2000

Related U.S. Application Data

(63) Continuation of application No. 08/818,325, filed on Mar. 14, 1997, now Pat. No. 6,077,790.

(51) Int. Cl.[7] .................................................. H01L 21/00
(52) U.S. Cl. ......................... 438/739; 438/719; 438/721; 438/756
(58) Field of Search ..................................... 438/712, 715, 438/719, 721, 723, 737, 739, 740, 743, 745, 755, 756; 216/67, 79, 99

(56) References Cited

U.S. PATENT DOCUMENTS

| | | | |
|---|---|---|---|
| 4,093,503 | 6/1978 | Harris et al. | 156/628 |
| 4,571,817 | 2/1986 | Birritella et al. | 437/18 |
| 5,275,972 | 1/1994 | Ogawa et al. | 438/740 X |
| 5,358,908 | 10/1994 | Reinberg et al. | 437/228 |
| 5,432,120 | 7/1995 | Meister et al. | 438/739 X |
| 5,484,740 | 1/1996 | Cho | 437/40 |
| 5,719,088 | 2/1998 | Huang et al. | 438/739 X |
| 5,899,749 | * 5/1999 | Becker et al. | 438/739 X |
| 5,997,757 | * 12/1999 | Nagayama et al. | 438/740 X |

OTHER PUBLICATIONS

U. Schnakenberg et al., TMAHW Etchants for Silicon Micromachining, 91CH2817–5/91/000–0815, IEEE, 815–818, 1991.

G.L. Kuhn et al., Thin Silicon Film on Insulating Substrate, J. Electrochem. Soc. Solid State Science and Technology, vol. 120, No. 11, 1563–1566, 1973.
Super Q Etch, Olin Electronic Materials, Olin Corporation, Chandler, AZ (1993).
Box Cell, Toshiba.

* cited by examiner

Primary Examiner—William Powell
(74) Attorney, Agent, or Firm—Workman, Nydegger & Seeley

(57) ABSTRACT

The present invention is directed toward building a microelectronic device in which a semiconductor substrate has thereon an etch buffer layer used in a processing method in which the buffer layer will act as an etch uniformity aid. In a method of making the microelectronic device, a semiconductor substrate is covered with an etch buffer layer and with an insulative layer. A first etch is performed by patterning and etching through a mask. The first etch penetrates the insulative layer, forms a cavity therein, and is selective to the buffer layer so as to expose the buffer layer. A second etch is performed that is selective to the insulative layer and the semiconductor substrate, and is not selective to the buffer layer. The buffer layer can be an insulative material of a type other than the material of the insulative layer or the buffer layer can also be of a conductive material. Where the buffer layer is of a conductive layer, the effect of the second etch is that the insulative layer is substantially undercut due to the etching of the buffer layer and due to selectivity to all other etch-exposed structures upon the semiconductor substrate. The undercut leaves a laterally-oriented second cavity within which lateral surfaces of the buffer layer are exposed. Following the second etch, a method of covering the laterally exposed surfaces of the buffer layer, exposed by the undercut, is chosen in order to isolate the remaining laterally exposed surfaces of the buffer layer. These methods include reflowing the insulative layer to cover the laterally exposed surfaces of the buffer layer, and forming a liner layer in the cavity to cover the laterally exposed surfaces of the buffer layer.

36 Claims, 5 Drawing Sheets

ETCHING PROCESS USING A BUFFER LAYER

RELATED APPLICATIONS

This is a continuation of U.S. patent application Ser. No. 08/818,325, filed on Mar. 14, 1997, titled "Etching Process Using a Buffer Layer", now U.S. Pat. No. 6,077,790, which is incorporated herein by reference.

BACKGROUND OF THE INVENTION

The Field of the Invention

The present invention involves etching processes in microelectronics technology. More particularly, the present invention involves methods of ameliorating etch rate uniformity problems in batch fabrication operations by providing a buffer layer to be etched on each semiconductor substrate in the batch. The present invention also ameliorates destructive etching into otherwise etch-selective structures on a semiconductor substrate due to unwanted prolonged etching into neighboring structures. In particular, the present invention involves use of an electrically conductive buffer layer on a semiconductor substrate that etches faster than other layers and surfaces incident to forming a cavity.

The Relevant Technology

In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. A semiconductor device refers to a semiconductor substrate upon which at least one microelectronic device has been or is being batch fabricated. A buffer layer in etch processing is a layer of a material to which a specific etch is selective.

Uniformity across a semiconductor device is a concern to the process engineer during many process steps in the fabrication of microelectronic devices. One such process step is formation of cavities by etching in which an etch may leave some cavities incompletely etched and others overetched such that an underlying layer is not exposed or is damaged, respectively.

The problem of etch uniformity can be ameliorated by performing a planarization step before the etch. If a planarization step is not done, and the layer to be etched is uneven, an etch may penetrate the layer and contact the substrate in some places where the layer was over the substrate, and the etch may not contact the substrate in some places where the layer was thick. Such an etch uniformity problem is illustrated in FIG. 1. In FIG. 1, which is a cross-sectional area, the exposing of a fragment of a semiconductor device 10 is illustrated wherein a substrate 12 has four gate stacks 14 built thereupon. Gate stacks 14 comprise a gate oxide layer (not shown), a polysilicon layer 16, a silicide layer 18, and an insulative nitride cap 20. Insulative nitride spacers 22 protect gate stacks 14. An insulative layer 26 covers gate stacks 14 and substrate 12.

FIG. 1 illustrates one example of etch an uniformity problem in which the plane of an insulative layer upper surface 28 is not parallel to the plane of a substrate upper surface 30. An etch of insulative layer 26 will lead to inconsistent etch depths. An etch cavity 32 fails to penetrate and thus fails to provide a completed cavity. An etch cavity 34 overexposes an active area or interconnect lower level and thus damages the underlying layer. In the case of FIG. 1, the underlying layer is substrate 12.

Another problem of etch uniformity is an inadequately executed etch-selective process in which, although selective to structures that are to remain, a prolonged etch will nonetheless damage structures as illustrated in FIG. 2. In FIG. 2, even if the topography of insulative layer 26 is planar, prominent structures on substrate 12, such as gate stacks 14, will be exposed to etching effects and detrimentally etched before substrate 12 is exposed.

What is needed is a method of etching a cavity that avoids the etch uniformity problems of the prior art.

SUMMARY OF THE INVENTION

The present invention is directed toward building a microelectronic device in which a semiconductor substrate uses an etch buffer layer in a processing method in which the buffer layer will act as an etch uniformity aid. The present invention is also directed toward an etch buffer layer that may have additional structural utility in the finished microelectronic device.

In one method of making the microelectronic device, a semiconductor substrate is covered with an etch buffer layer formed of a conductive material and with an insulative layer. A first etch is performed by patterning and etching through a mask. This first etch penetrates the insulative layer and forms a cavity. This first etch is selective to the buffer layer and leaves a first cavity that exposes the buffer layer.

A second etch is performed that is selective to the insulative layer and the semiconductor substrate while etching the buffer layer. The effect of the second etch is that the insulative layer is substantially undercut due to the etch of the buffer layer and due to selectivity to all other etch-exposed structures of the semiconductor substrate. The undercut leaves a laterally-oriented second cavity within which lateral surfaces of the buffer layer are exposed and which forms a space between the top of prominent semiconductor substrate features and the insulative layer.

Following the second etch, a method of covering the laterally exposed surfaces of the buffer layer exposed by the undercut is chosen in order to isolate the remaining laterally exposed surfaces of the buffer layer. Isolation is required when the buffer layer is electrically conductive and the first cavity is filled with an electrically conductive material such as an interconnect or bit line contact. One preferred method of covering the laterally exposed surfaces of the buffer layer is by partial reflow of the insulative layer. Partial reflow will cause materials above the undercut area to sag and close off the undercut. Partial reflow of the insulative layer can be accomplished by rapid thermal processing (RTP). Another preferred method of covering the laterally exposed surfaces of the buffer layer is by filling the undercut with another material. Filling the undercut with another material is accomplished by forming a liner layer that deposits within the first and the second cavities.

The buffer layer in a further embodiment is formed from an insulative material. One example of a suitable insulative material is oxide deposited by decomposition of tetraethyl orthosilicate (TEOS). Thus, for example, the buffer layer can be formed of TEOS, and the insulative layer formed of a material such as borophosphosilicate glass (BPSG). The first etching process is then preferably conducted as an anisotropic dry etch, and the second etching process is conducted with an etchant comprising tetramethyl ammonium hydroxide (TMAH) in an aqueous solution of dilute HF.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is directed toward providing a buffer layer over semiconductor device structures to protect them during etch processing. The buffer layer will act as an etch uniformity aid, and is optionally non-sacrificial such that it may have structural utility in the finished semiconductor device.

Figure 1:
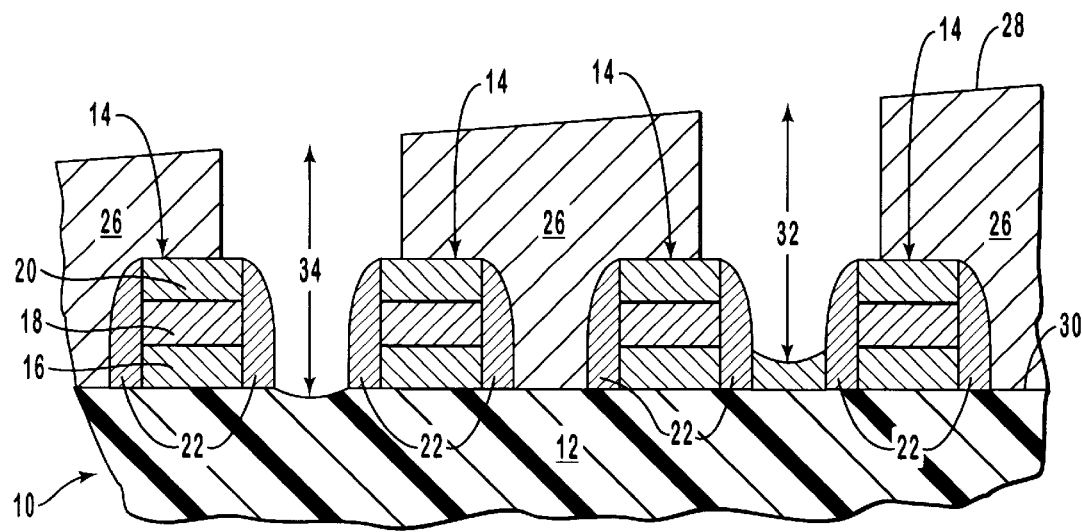
FIG. 1 is a cross sectional elevation prior art depiction of one type of etch uniformity problem.
Figure 2:
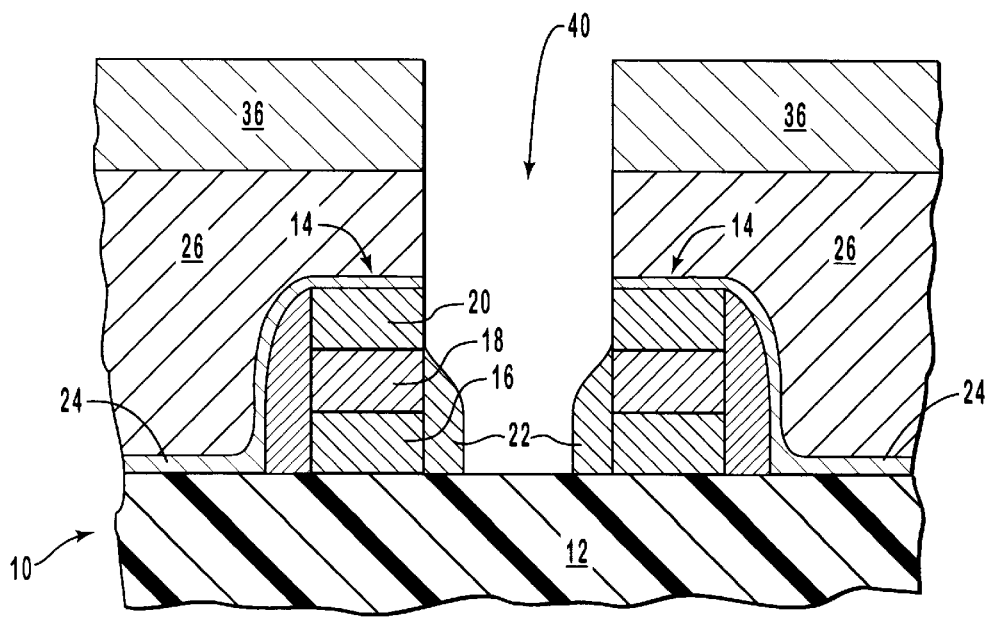
FIG. 2 is a cross sectional elevation prior art depiction of inadequately conducted etch that contacts prominent structures that are intended to remain unetched.
Figure 3:
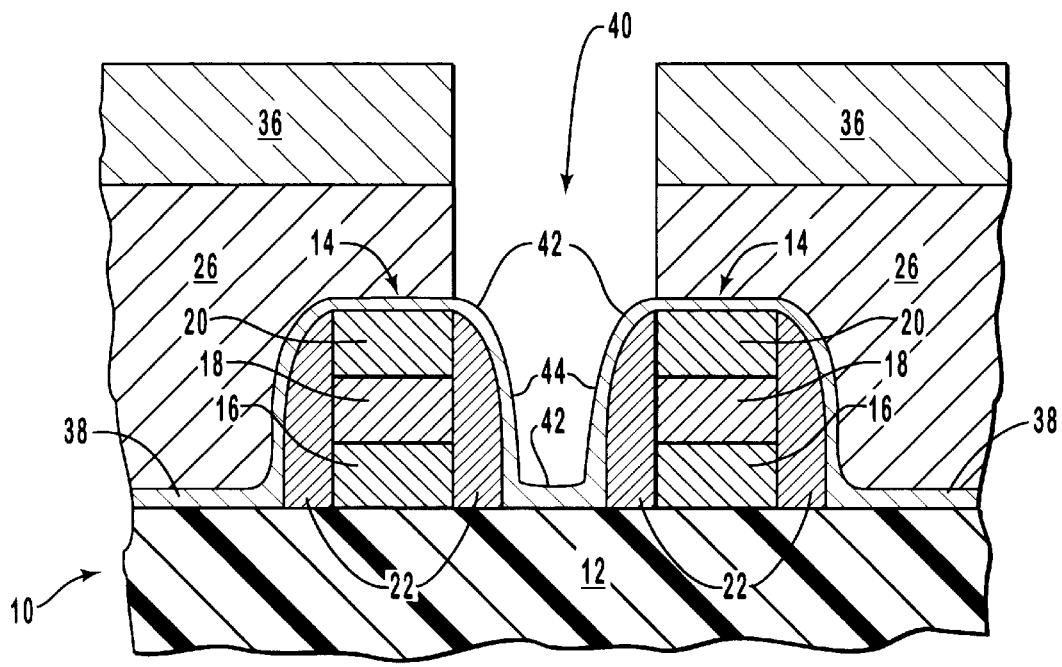
FIG. 3 is a cross sectional elevation illustration of two gate stacks on a substrate that is covered with a substantially conformal buffer layer, and further illustrates a cavity that has been etched into an insulating layer with an etch that stops on the buffer layer.

FIG. 3 illustrates a method of making a semiconductor device 10. FIG. 3 depicts a cross-sectional area in which a substrate 12 with active areas (not shown) contains, by way of non-limiting example, a pair of gate stacks 14 each comprising a gate oxide layer (not shown), a polysilicon layer 16, a silicide layer 18, and a cap 20. In addition, a spacer 22 is formed on lateral surfaces of each gate stack, and a buffer layer 38 lies substantially conformably over gate stacks 14 and substrate 12. FIG. 3 illustrates a cavity 40 formed by an etch that stops on buffer layer 38. Prior to forming cavity 40, the device at this point in manufacture is covered with an insulative layer 26.

The buffer layer proposed herein is in one embodiment substantially composed of a conductive material such as a refractory metal silicide, a refractory metal nitride, or a doped polysilicon. Examples of buffer layers formed out of conductive materials include titanium nitride, tantalum nitride, cobalt nitride, tungsten nitride, titanium silicide, tantalum silicide, cobalt silicide, tungsten silicide, p-doped polysilicon, and n-doped polysilicon, their combinations, and equivalents. Examples of the insulative layer that covers the device being fabricated are borophosphosilicate glass (BPSG), borosilicate glass (BSG), phosphosilicate glass (PSG), silica, zirconia, thoria, ceria, doped silicon dioxide, and the like depending upon the specific application.

Formation of the buffer layer can be by chemical vapor deposition (CVD) of titanium for example, followed by a nitrogen treatment to form titanium nitride or by direct deposition of titanium nitride by CVD. Formation can also be by physical vapor deposition (PVD) of e.g. either titanium nitride or of titanium followed by nitrogen treatment to form titanium nitride. Formation can also be done by depositing doped and undoped polysilicon. Depositing doped or undoped polysilicon can be done by in-situ CVD. In-situ doping will cause a uniformly doped buffer layer to form. Ion implantation can form regions in the buffer layer that are more heavily doped than others where a unidirectional implant will cause implant shadows. With directional implantation, specific regions of the buffer layer will etch more or less readily than others. For example, a vertical ion implantation of the buffer layer before formation of the insulative layer will cause the top surface-exposed regions of the buffer layer to be more doped than the vertically oriented surface-exposed regions thereof In anisotropic etches, etch selectivity can be chosen to favor the areas of the buffer layer that received more implanted ions, or visa versa.

Etching of the buffer layer is done with an etch recipe that has an etch selectivity that is preferential over all other layers and structures that are exposed during a cavity etch. In other words, the buffer layer will etch at a rate that removes all other exposed structures and leaves the buffer layer substantially unetched, or vice versa.

Figure 4:
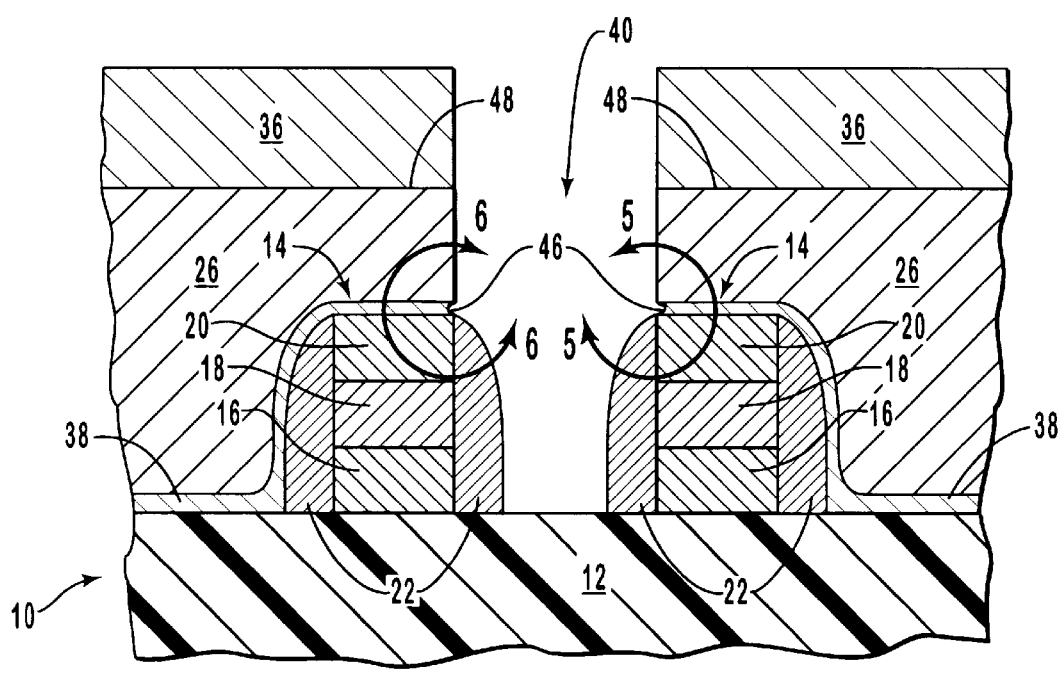
FIG. 4 is a cross sectional elevation illustration of further processing illustrated in FIG. 3 in which an undercut of the insulative layer has been caused by an etch in which the buffer layer has receded.

In the method of the present invention seen in FIG. 3 and 4, a first anisotropic etch is performed by patterning and etching through a mask 36 that has been formed upon an upper surface 48 of insulative layer 26. Anisotropic etching penetrates insulative layer 26 in an etch that is selective to buffer layer 38. Buffer layer 38 is not substantially etched in comparison with etch of insulative layer 26. Etching anisotropically according to this first etch is etch selective to buffer layer 38 such that nonuniform regions, if any, of insulative layer 26 will all be etched down to the etch stop of buffer layer 38. Anisotropic etching leaves a cavity 40 that exposes buffer layer 38 at the bottom of cavity 40 as seen in FIG. 3.

FIG. 4 illustrates further processing of device 10 as was illustrated in FIG. 3. A second etch is performed through mask 36 that is selective to insulative layer 26, spacers 22, cap 20 and substrate 12. FIG. 4 illustrates the effect of the second etch in which cavity 40 may be widened. Depending upon the etch recipe, insulative layer 26 is substantially undercut above gate stacks 14 due to the etch of buffer layer 38 and due to selectivity of the etch recipe of the second etch to all materials other than buffer layer 38 that are exposed to the etch. Buffer layer 38 is exposed at lateral surfaces 46 within the region that undercuts insulative layer 26. In the second etch, buffer layer 38 etches at a rate such that all other exposed structures may be substantially unetched. Where substantially no etching occurs except for buffer layer 38, cavity 40 may not be widened as depicted in FIG. 4.

There are a few preferred examples of the second etch. One example is a sulfuric acid etch with hydrogen peroxide, referred to as "piranha." Another example is a hydrochloric acid and hydrogen peroxide (HPM) etch. Yet another example is an ammonium hydroxide with hydrogen peroxide and water (APM) etch. Industry standard solutions of these etch examples will etch titanium nitride at the rates of 8 Å/sec, 257 Å/sec, and 17 Å/sec, respectively. Varying the etch rate can be accomplished by etch recipe, by etch medium concentration changes, by etch temperature changes, and by combinations thereof Following the second etch, a method of isolating lateral surfaces 46 of buffer layer 38 is chosen. Isolation is required when buffer layer 38 is electrically conductive because an electrically conductive material will be deposited into cavity 40. The electrically conductive material deposited into cavity 40 will serve as a contact such as an interconnect or bit line contact. Two preferred means of isolating lateral surfaces 46 of buffer layer 38 is to either close the undercut region by reflow of insulative layer 26, or by plugging or blocking off the undercut region with another material. Reflow of insulative layer 26 is accomplished by methods such as rapid thermal processing (RTP).

Figure 5:
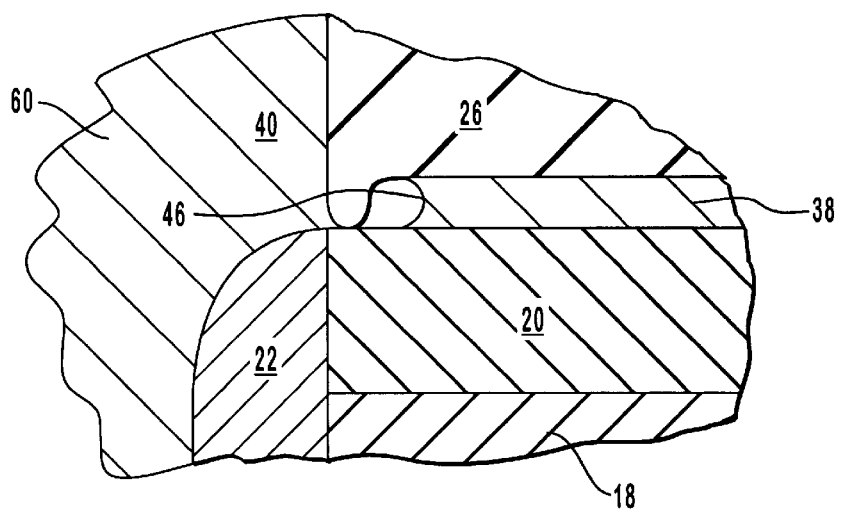
FIG. 5 is an illustration of a section taken along the line 5—5 in FIG. 4 and depicting a partial reflow of an insulative layer after an RTP anneal, and a contact plug in the cavity that is electrically isolated by the reflowed insulative layer covering over the area where the buffer layer has receded at the undercut below the insulative layer.

Closing the undercut by reflow of insulative layer 26 can be done when buffer layer 38 is resistant to reflow at temperatures and exposures where reflow is likely for insulative layer 26. Reflow is illustrated in FIG. 5. FIG. 5 is a detail of FIG. 4 taken along the line 5—5 after an RTP anneal that achieves reflow of insulative layer 26 according to the present invention. For example, where buffer layer 38 is titanium nitride and insulative layer 26 is BPSG, an RTP anneal of device 10 can cause reflow that will not close cavity 40 but will cause insulative layer 26 to sag above exposed lateral surfaces 46 of buffer layer 38, thus isolating exposed lateral surfaces 46 of buffer layer 38 from cavity 40.

Reflow can be accomplished by known methods. Preferred is an RTP process in which reflow causes the undercut area to close but does not cause cavity 40 to close. Also, depression formation on upper surface 48 of insulative layer 26 is minimal such that a planarization is not needed, nor are depth-of-field problems caused by formation of these depressions.

Conditions of reflow for the present invention, by way of non-limiting example, are given for a BPSG insulative layer 26 and a titanium nitride buffer layer 38. Buffer layer 38 preferentially has a thickness in a range from about 100 Å to 100 Å, more preferably in a range from about 150 Å to about 300 Å, and most preferably about 200 Å. Materials other than titanium nitride will have most preferred thicknesses that are not necessarily the same as that of titanium nitride, and these thicknesses are considered to be determinable by one of ordinary skill in the art within routine experimentation. An RTP reflow for BPSG is carried out under conditions of a nitrogen atmosphere, in a time range from about 10 seconds to about 30 seconds, and in a temperature range from about 750° C. to about 900° C. More preferred conditions are RTP under a nitrogen atmosphere, in a time range from about 15 to 25 seconds and in a temperature range from about 775 to about 850° C., and most preferred time in a range of about 20 seconds and a temperature range of about 800° C.

Use of RTP in the present invention is desirable to cause reflow that results in sag and therefore closure of insulative layer 26 over lateral surfaces 46 of buffer layer 38 without causing closure of cavity 40. Factors used in determining this desirable result are the material making up insulative layer 26, the degree of undercutting of insulative layer 26 caused by recession of buffer layer 38 above gate stacks 14, and the other conditions of time, temperature, and atmosphere. RTP reflow conditions for materials other than BPSG are determinable within the ordinary level of skill of the artisan without undue experimentation.

After the closure of insulative layer 26 over lateral surfaces 46 of buffer layer 38, a contact plug 60 seen in FIG. 5 can be formed in cavity 40 that is in electrical contact with a contact opening on substrate 12 seen in FIG. 4. As can be seen, contact plug 60 is electrically isolated from buffer layer 38 by insulative layer 26.

Figure 6:
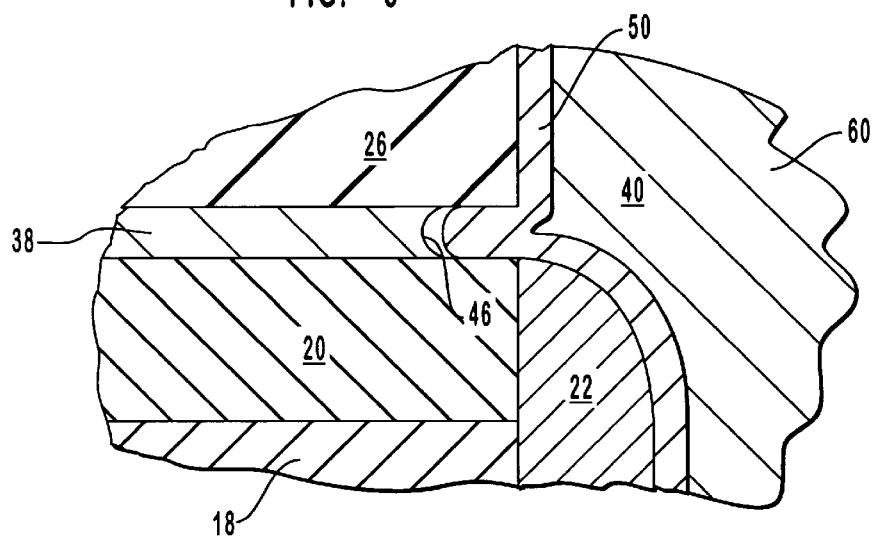
FIG. 6 is an illustration taken along line 6—6 of FIG. 4 after formation of a liner layer that is formed to cover laterally exposed surfaces of the buffer layer in the cavity.

Isolating exposed lateral surfaces 46 of buffer layer 38 can also be accomplished by forming a liner layer 50 out of a suitable material. One example of such a suitable material is silicon nitride. FIG. 6 is a detail of FIG. 4 taken along the line 6—6 after formation of liner layer 50. Liner layer 50 also deposits into the undercut region next to lateral surfaces 46 of buffer layer 38. In this option for isolating exposed lateral surfaces 46 of buffer layer 38, liner layer 50 is deposited under conditions that cause the undercut region to fill until buffer layer 38 is isolated from cavity 40. A preferred process is high pressure chemical vapor deposition (HPCVD) in which the mean free path of the vapor molecules between collisions is shortened. A shortened mean free path means that HPCVD molecules will have predominantly omnidirectional collisions. Omnidirectional collisions will cause more HPCVD molecules to deposit upon exposed lateral surfaces 46 of buffer layer 38.

Figure 7:
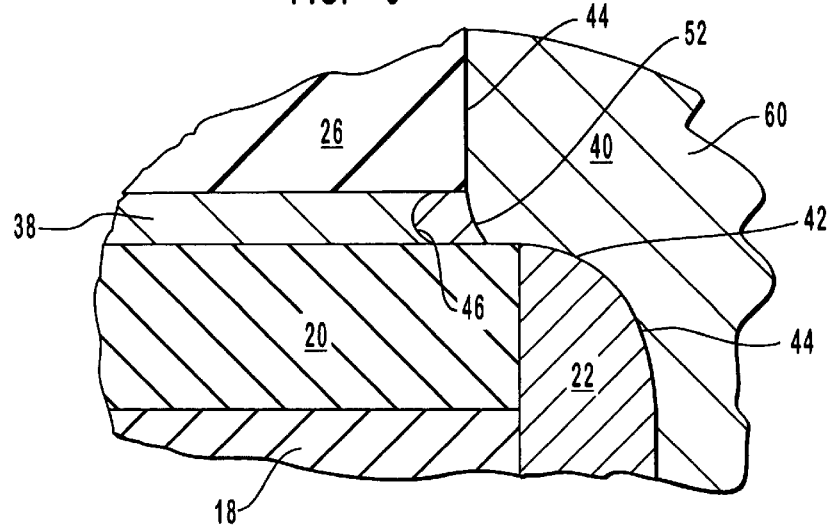
FIG. 7 is an illustration of further processing of the structure depicted in FIG. 6 in which an etch has removed a liner layer except in areas where the liner layer has filled into an undercut region, and a contact plug in the cavity is electrically isolated from the buffer layer where the liner layer has filled into an undercut region.

Following the formation of liner layer 50, portions of liner layer 50 are removed, such as in an anisotropic etch. FIG. 7 illustrates details of further processing of device 10 following an anisotropic etch. Removal of portions of liner layer 50 by anisotropic etching leave a liner residuum 52 in the undercut region next to lateral surfaces 46 of buffer layer 38. such that buffer layer 38 remains isolated from cavity 40. FIG. 7 illustrates substantially total removal of liner layer 50 from top surface-exposed regions 44 of spacers 22 and from side surface-exposed regions 44 of spacers 22 and insulative layer 26. Total removal is not necessary. In this example, substrate 12 at the bottom of cavity 40 is exposed sufficiently at a contact opening on substrate 12 seen in FIG. 4 to make contact with a subsequently-deposited contact plug or the like. After the closure of liner residuum 52 in the undercut region next to lateral surfaces 46 of buffer layer 38, a contact plug 60 seen in FIG. 6 can be formed in cavity 40 that is in electrical contact with the contact opening on substrate 12 seen in FIG. 4. As can be seen in FIG. 7, contact plug 60 is electrically isolated from buffer layer 38 by liner residuum 52.

Figure 8:
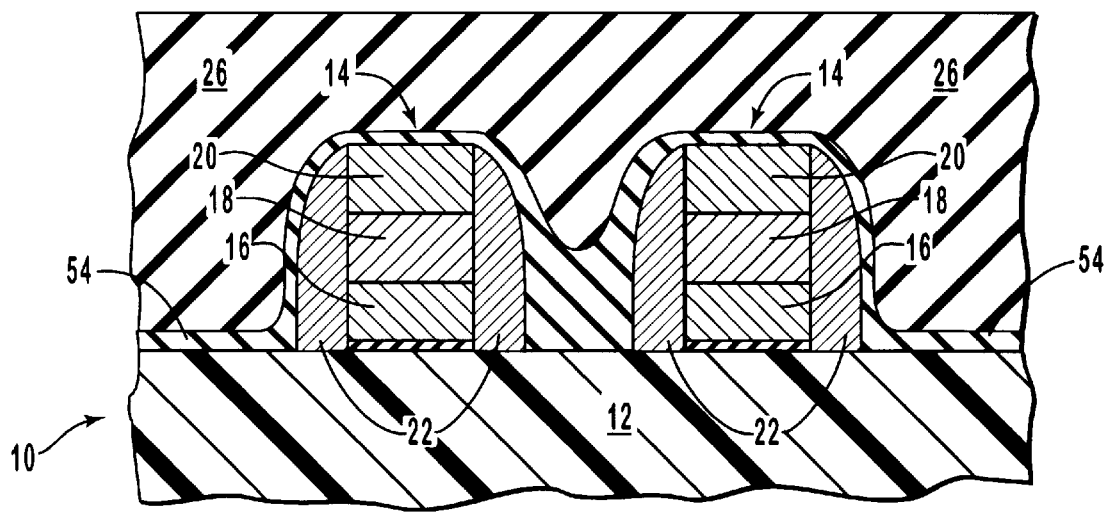
FIG. 8 illustrates a cross sectional elevation illustration of an alternative embodiment of the present invention in which the preferred buffer layer is formed of an insulating material.
Figure 9:
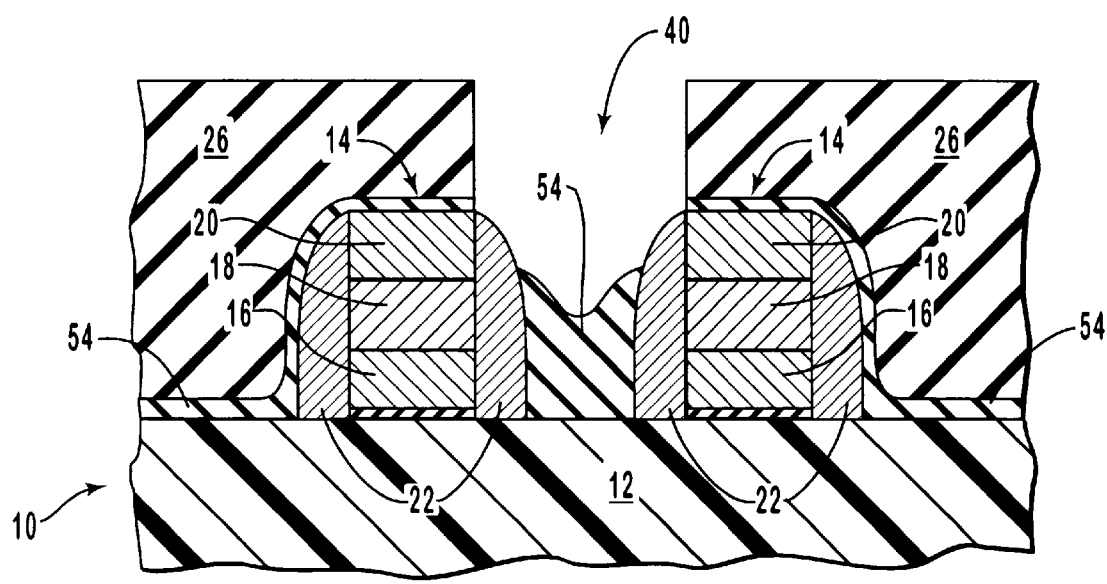
FIG. 9 is a cross sectional elevation illustrating further processing steps upon the structure illustrated in FIG. 8.
Figure 10:
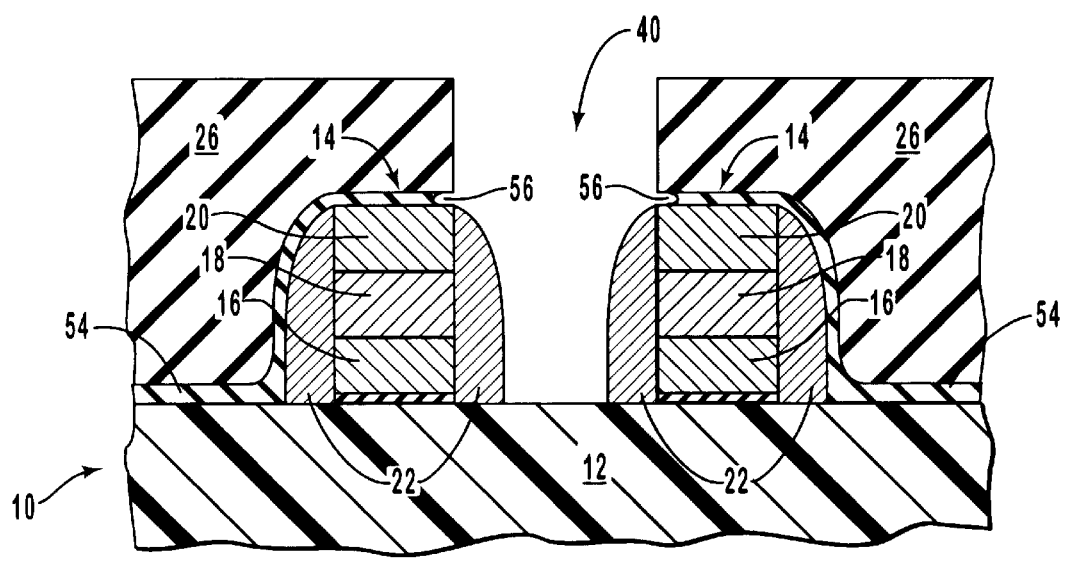
FIG. 10 is a cross sectional elevation illustrating further processing steps upon the structure illustrated in FIG. 9.

In a further embodiment, the buffer layer of the present invention is formed of an insulative material which is of a type other than the type of insulative material of insulative layer 26. One example given by way of illustration and not limitation is shown in FIGS. 8 through 10. As seen in FIG. 8, a semiconductor device 10 is depicted that is configured essentially the same as semiconductor device 10 of FIG. 3, with the exception that the buffer layer 54 of FIG. 8 is formed of an insulating material. In the embodiment of FIG. 8, buffer layer 54 is formed of an oxide that is formed from the decomposition of tetraethyl orthosilicate (TEOS). Insulative layer 26 is formed of BPSG.

In further processing shown in FIG. 9, insulative layer 26 is masked and etched with a first etching process comprising anisotropic dry etching to form a cavity 40. The dry etching is conducted for sufficient time to remove the portion of insulative layer 26 above and between gate stacks 14, but does not fully remove the portion of buffer layer 54 located between gate stacks. Typically, a thickness of about 300 angstroms of buffer layer 54 is left remaining between gate stacks 14.

Thereafter, a second etching process is conducted in which the remainder of buffer layer 54 located between gate stacks 14 is removed in a manner that is selective to gate stacks 14, insulative layer 26, and substrate 12. In one manner of conducting the second etching process, a volume of TMAH in an aqueous HF solution is employed as an etchant. This etching process has been found to etch the TEOS layer about 6 times faster than gate stacks 14, insulative layer 26, and substrate 12. The weight percentage of TMAH and HF are selected according to criteria of the desired etching process.

The structure resulting from the second etching process is shown in FIG. 10. As seen therein, cavity 40 is widened only slightly, typically about 50 angstroms around the entire sidewall thereof. An undercutting 56 of buffer layer 54 also occurs, but does not prevent the use of cavity 40 for forming a contact down to substrate 12.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A fabrication method comprising:
   providing an substrate surface having a contact thereon and an electrically insulated structure upon the substrate surface that is adjacent to the contact;
   forming a buffer layer upon the contact and the electrically insulated structure;
   forming a dielectric layer upon the buffer layer;
   forming a recess in the dielectric layer adjacent to the electrically insulated structure to expose the buffer layer;
   removing the buffer layer to:
     extend the recess to expose the contact on the substrate surface; and
     expose a top surface on the electrically insulated structure;
   reflowing the dielectric layer to contact the exposed top surface on the electrically insulated structure; and
   forming an electrically conductive structure within the recess and upon the contact on the substrate surface.

2. The method as defined in claim 1, wherein reflowing the dielectric layer forms a closed cavity above the electrically insulated structure and below the dielectric layer, the cavity being defined by:
   the exposed top surface of the electrically insulated structure;
   the dielectric layer; and
   the buffer layer.

3. The method as defined in claim 1, wherein the buffer layer is electrically conductive.

4. The method as defined in claim 1, wherein said buffer layer is selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon.

5. A method according to claim 1, wherein:
   the buffer layer is electrically conductive, is removed with an anisotropic dry etch;
   the recess in the dielectric layer is formed with a wet etch which is conducted with an etchant comprised of TMAH and HF.

6. A method of fabricating a semiconductor device, the method comprising:
   providing a semiconductor substrate having an upper surface, the upper surface having a contact thereon and an electrically insulated gate stack upon the upper surface that is adjacent to the contact;
   forming a buffer layer upon the contact and the electrically insulated gate stack;
   forming a dielectric layer upon the buffer layer;
   removing the dielectric layer selectively to the buffer layer to forming a contact hole adjacent to the electrically insulated gate stack;
   removing the buffer layer selectively to both the electrically insulated gate stack and the semiconductor substrate to:
     extend the contact hole adjacent to the electrically insulated gate stack to expose the contact on the upper surface of the semiconductor substrate; and
     expose a top surface on the electrically insulated gate stack;
   reflowing the dielectric layer to contact the exposed top surface on the electrically insulated gate stack; and
   forming an electrically conductive structure within the contact hole and upon the contact on the upper surface of the semiconductor substrate.

7. The method as defined in claim 6, wherein reflowing the dielectric layer forms a closed cavity above the electrically insulated gate stack and below the dielectric layer, the cavity being defined by:
   the exposed top surface of the electrically insulated gate stack;
   the dielectric layer; and
   the buffer layer.

8. The method as defined in claim 6, wherein the buffer layer is electrically conductive.

9. The method as defined in claim 6, wherein the buffer layer comprises a material selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon.

10. A method according to claim 6, wherein:
    the buffer layer is electrically conductive, is removed with an aniisotropic dry etch;

the contact hole in the dielectric layer is formed with a wet etch which is conducted with an etchant comprised of TMAH and HF.

11. A method of fabricating a semiconductor device, the method comprising:
providing a semiconductor substrate having an upper surface, the upper surface having a contact thereon and a pair of electrically insulated gate stacks upon the upper surface that are separated by the contact;
forming a buffer layer upon the contact and the pair of electrically insulated gate stacks,
forming a dielectric layer upon the buffer layer;
removing the dielectric layer selectively to the buffer layer to forming a contact hole between the pair of electrically insulated gate stacks;
removing the buffer layer selectively to both the pair of electrically insulated gate stacks and the semiconductor substrate to:
extend the contact hole between the pair of electrically insulated gate stacks to expose the contact on the upper surface of the semiconductor substrate; and
expose a top surface on each said electrically insulated gate stack;
reflowing the dielectric layer to contact the exposed top surface on each said electrically insulated gate stack; and
forming an electrically conductive structure within the contact hole and upon the contact on the upper surface of the semiconductor substrate.

12. The method as defined in claim 11, wherein reflowing the dielectric layer forms a closed cavity above each said electrically insulated gate stack and below the dielectric layer, each said cavity being defined by:
the exposed top surface of a respective one of said electrically insulated gate stacks;
the dielectric layer; and
the buffer layer.

13. The method as defined in claim 11, wherein the buffer layer is electrically conductive.

14. The method as defined in claim 11, wherein the buffer layer comprises a material selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon.

15. A method according to claim 11, wherein:
the buffer layer is electrically conductive, is removed with an anisotropic dry etch;
the contact hole in the dielectric layer is formed with a wet etch which is conducted with an etchant comprised of TMAH and HF.

16. A fabrication method comprising:
providing a substrate surface having a contact thereon and an electrically insulated structure upon the substrate surface adjacent to the contact;
forming a buffer layer upon the contact and the electrically insulated structure;
forming a dielectric layer upon the buffer layer;
forming a recess in the dielectric layer adjacent to the electrically insulated structure to expose the buffer layer;
extending the recess through the buffer layer to expose:
the contact on the substrate surface; and
a top surface on the electrically insulated structure;
forming a liner layer within the recess and upon:
the dielectric layer;
the exposed top surface on the electrically insulated structure; and
a lateral surface of the electrically insulated structure;
forming an electrically conductive structure within the recess and upon the contact on the substrate surface.

17. The method as defined in claim 16, wherein forming a liner layer forms a closed cavity above the electrically insulated structure and below the dielectric layer, the closed cavity being defined by:
the exposed top surface of the electrically insulated structures;
the dielectric layer;
the buffer layer; and
the liner layer.

18. The method as defined in claim 16, wherein the buffer layer is electrically conductive.

19. The method as defined in claim 16, further comprising, after forming a liner layer and before forming an electrically conductive structure, removing a portion of the liner layer that is within the recess while leaving another portion of the liner layer that is above the electrically insulated structure and below the dielectric layer.

20. The method as defined in claim 19, wherein said another portion of the liner layer is in contact with:
the exposed top surface of the electrically insulated structure;
the dielectric layer; and
the buffer layer.

21. The method as defined in claim 20, wherein said another portion of the liner layer is in contact with the electrically conductive structure.

22. The method as defined in claim 16, wherein:
the buffer layer comprises a material selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon; and
the dielectric layer comprises a material selected from a group consisting of doped silicon dioxide, PSG, BSG, BPSG, silica, zirconia, thoria, and ceria.

23. A method of fabricating a semiconductor device, the method comprising:
providing a semiconductor substrate having an upper surface, the upper surface having a contact thereon and an electrically insulated gate stack upon the upper surface adjacent to the contact;
forming a buffer layer upon the contact and the electrically insulated gate stack;
forming a dielectric layer upon the buffer layer;
removing the dielectric layer selectively to the buffer layer to forming a contact hole adjacent to the electrically insulated gate stack;
removing the buffer layer selectively to the electrically insulated gate stack and the semiconductor substrate to:
extend the contact hole adjacent to the electrically insulated gate stack to expose the contact on the upper surface of the semiconductor substrate; and
expose a top surface on the electrically insulated gate stack;
forming a liner layer within the contact hole and upon:
the dielectric layer;
the exposed top surface on the electrically insulated gate stack; and a lateral surface of the electrically insulated gate stack;

forming an electrically conductive structure within the contact hole and upon the contact on the upper surface of the semiconductor substrate.

24. The method as defined in claim 23, wherein forming a liner layer forms a closed cavity above the electrically insulated gate stack and below the dielectric layer, the closed cavity being defined by:

the exposed top surface of the electrically insulated gate stacks;

the dielectric layer;

the buffer layer; and the liner layer.

25. The method as defined in claim 23, wherein the buffer layer is electrically conductive.

26. The method as defined in claim 23, further comprising, after forming a liner layer and before forming an electrically conductive structure, removing a portion of the liner layer that is within the contact hole while leaving another portion of the liner layer that is above the electrically insulated gate stack and below the dielectric layer.

27. The method as defined in claim 26, wherein said another portion of the liner layer is in contact with:

the exposed top surface of the electrically insulated gate stack;

the dielectric layer; and the buffer layer.

28. The method as defined in claim 27, wherein said another portion of the liner layer is in contact with the electrically conductive structure.

29. The method as defined in claim 23, wherein:

the buffer layer comprises a material selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon; and the dielectric layer comprises a material selected from a group consisting of doped silicon dioxide, PSG, BSG, BPSG, silica, zirconia, thoria, and ceria.

30. A method of fabricating a semiconductor device, the method comprising:

providing a semiconductor substrate having an upper surface, the upper surface having a contact thereon and a pair of electrically insulated gate stacks upon the upper surface that are separated by the contact;

forming a buffer layer upon the contact and the pair of electrically insulated gate stacks;

forming a dielectric layer upon the buffer layer;

removing the dielectric layer selectively to the buffer layer to forming a contact hole between the pair of electrically insulated gate stacks;

removing the buffer layer selectively to both the pair of electrically insulated gate stacks and the semiconductor substrate to:

extend the contact hole between the pair of electrically insulated gate stacks to expose the contact on the upper surface of the semiconductor substrate; and expose a top surface on each said electrically insulated gate stack;

forming a liner layer within the contact hole and upon:

the dielectric layer;

the exposed top surface on each said electrically insulated gate stack; and a lateral surface on each said electrically insulated gate stack;

forming an electrically conductive structure within the contact hole and upon the contact on the upper surface of the semiconductor substrate.

31. The method as defined in claim 30, wherein forming a liner layer forms a closed cavity above each said electrically insulated gate stack and below the dielectric layer, each said closed cavity being defined by:

the exposed top surface of a respective one of said electrically insulated gate stacks;

the dielectric layer;

the buffer layer; and the liner layer.

32. The method as defined in claim 30, wherein the buffer layer is electrically conductive.

33. The method as defined in claim 30, further comprising, after forming a liner layer and before forming an electrically conductive structure, removing a portion of the liner layer that within the contact hole while leaving another portion of the liner layer that is above each said electrically insulated gate stack and below the dielectric layer.

34. The method as defined in claim 31, wherein each said another portion of the liner layer is in contact with:

the exposed top surface of a respective one of said electrically insulated gate stacks;

the dielectric layer; and the buffer layer.

35. The method as defined in claim 34, wherein each said another portion of the liner layer is in contact with the electrically conductive structure.

36. The method as defined in claim 30, wherein:

the buffer layer comprises a material selected from the group consisting of titanium nitride, tantalum nitride, cobalt nitride, tungsten nitride, titanium silicide, tantalum silicide, cobalt silicide, tungsten silicide, p-doped polysilicon, and n-doped polysilicon; and the dielectric layer comprises a material selected from a group consisting of doped silicon dioxide, PSG, BSG, BPSG, silica, zirconia, thoria, and ceria.

* * * * *

UNITED STATES PATENT AND TRADEMARK OFFICE
CERTIFICATE OF CORRECTION

PATENT NO. : 6,191,047 B1
DATED : February 20, 2001
INVENTOR(S) : Li Li, Zhiqiang Wu, Kunal R. Parekh It is certified that error appears in the above-identified patent and that said Letters Patent is hereby corrected as shown below:

Column 1,
Line 62, after "example of" change "etch an" to -- an etch --

Column 3,
Line 8, change "that" to -- to illustrate --
Line 22, before "inadequately" insert -- an --

Column 4,
Line 42, after "thereof" insert -- . --
Line 59, after "with" insert -- the --

Column 5,
Line 25, after "thereof" insert -- . --
Line 33, after "layer 38" change "is" to -- are --
Line 62, change "100" to -- 1000 --

Column 6,
Line 50, after "layer 38" change "." to -- , --

Column 7,
Line 49, after "providing" change "an" to -- a --

Column 8,
Line 33, after "layer to" change "forming" to -- form --
Line 67, before "dry" change "aniisotropic" to -- anisotropic --

Column 9,
Line 15, after "layer to " change "forming" to -- form --

Column 10,
Line 55, after "layer to" chagne "forming" to -- form --

UNITED STATES PATENT AND TRADEMARK OFFICE
CERTIFICATE OF CORRECTION

PATENT NO. : 6,191,047 B1
DATED : February 20, 2001
INVENTOR(S) : Li Li, Zhiqiang Wu, Kunal R. Parekh It is certified that error appears in the above-identified patent and that said Letters Patent is hereby corrected as shown below:

<u>Column 11,</u>
Line 53, after "layer to" change "forming" to -- form --

Signed and Sealed this

Twenty-sixth Day of March, 2002

Attest:

Attesting Officer

JAMES E. ROGAN
Director of the United States Patent and Trademark Office